United States Patent

Binnard et al.

(10) Patent No.: US 6,731,372 B2
(45) Date of Patent: May 4, 2004

(54) MULTIPLE CHAMBER FLUID MOUNT

(75) Inventors: Mike Binnard, Belmont, CA (US); Douglas C. Watson, Campbell, CA (US)

(73) Assignee: Nikon Corporation (JP)

( * ) Notice: Subject to any disclaimer, the term of this patent is extended or adjusted under 35 U.S.C. 154(b) by 322 days.

(21) Appl. No.: 09/818,163

(22) Filed: Mar. 27, 2001

(65) Prior Publication Data

US 2002/0140916 A1 Oct. 3, 2002

(51) Int. Cl.[7] .................. G03B 27/42; F16M 13/00; F01B 7/00
(52) U.S. Cl. .................. 355/53; 248/636; 248/562; 92/151
(58) Field of Search ................. 355/53, 72, 77, 355/73; 248/636, 562, 564; 92/143, 151, 152

(56) References Cited

U.S. PATENT DOCUMENTS

| | | | | |
|---|---|---|---|---|
| 4,773,306 A | * | 9/1988 | Dirkin | 92/151 |
| 5,285,995 A | * | 2/1994 | Gonzalez et al. | 248/550 |
| 5,341,725 A | * | 8/1994 | Dick | 92/66 |
| 5,623,861 A | * | 4/1997 | Ward et al. | 91/420 |
| 5,844,666 A | | 12/1998 | Van Engelen et al. | |
| 5,931,441 A | | 8/1999 | Sakamoto | |
| 6,036,162 A | * | 3/2000 | Hayashi | 248/550 |

FOREIGN PATENT DOCUMENTS

| | | |
|---|---|---|
| JP | 9-15307 | 11/1934 |
| JP | 08-170990 | 7/1996 |
| JP | 11-295901 | 10/1999 |
| JP | 2000-154843 | 6/2000 |
| JP | 2001-12527 | 1/2001 |
| WO | WO 02/077485 A1 | 10/2002 |

OTHER PUBLICATIONS

PCT/JP02/02916 Search Report Jun. 7, 2002.

* cited by examiner

Primary Examiner—David Gray
Assistant Examiner—D. Ben Esplin
(74) Attorney, Agent, or Firm—Steven G. Roeder; Jim Rose

(57) ABSTRACT

A fluid mount (10) for an exposure apparatus (32) includes a first subsystem (12) and a second subsystem (14). The first subsystem (12) includes a first cylinder (18) and a first piston (20). The first piston (20) moves within the first cylinder (18) along a first axis (26). The second subsystem (14) includes a second cylinder (22) and a second piston (24). The second piston (24) moves within the second cylinder (22) along a second axis (28). Importantly, (i) the second subsystem (14) is stacked on top of the first subsystem (12), (ii) the second axis (28) is substantially coaxial with the first axis (26), and (iii) the first piston (20) is connected to the second piston (24) with a piston connector (16). The resulting fluid mount (10) has a relatively high load carrying capacity and a relatively small footprint.

42 Claims, 8 Drawing Sheets

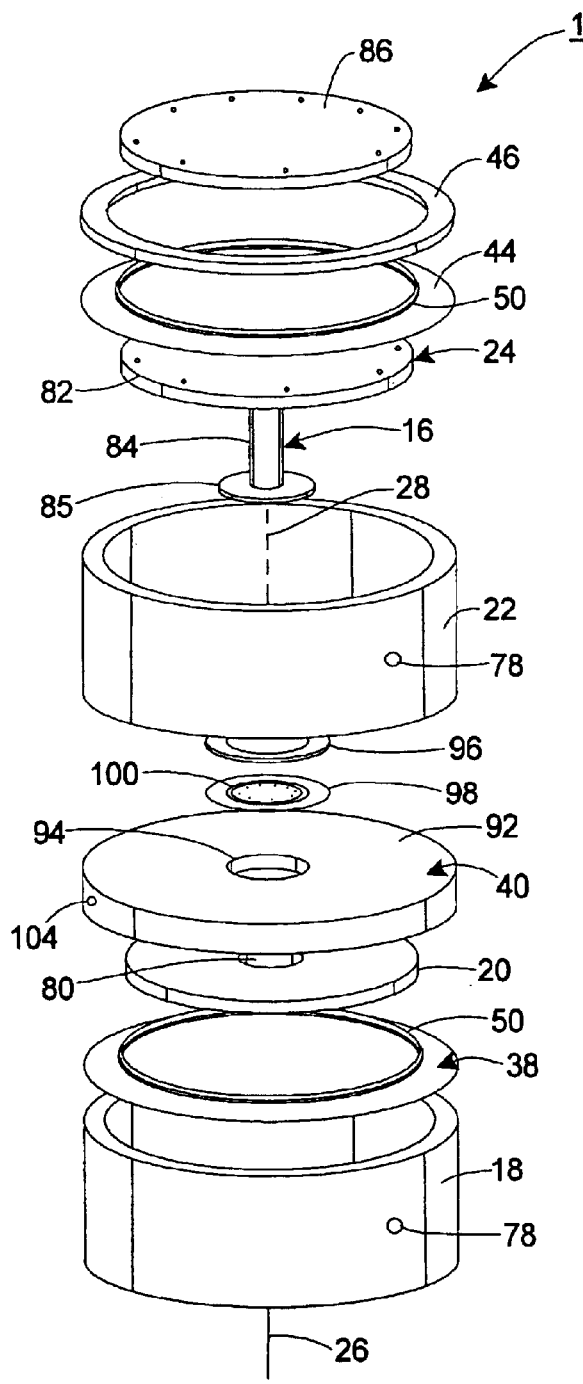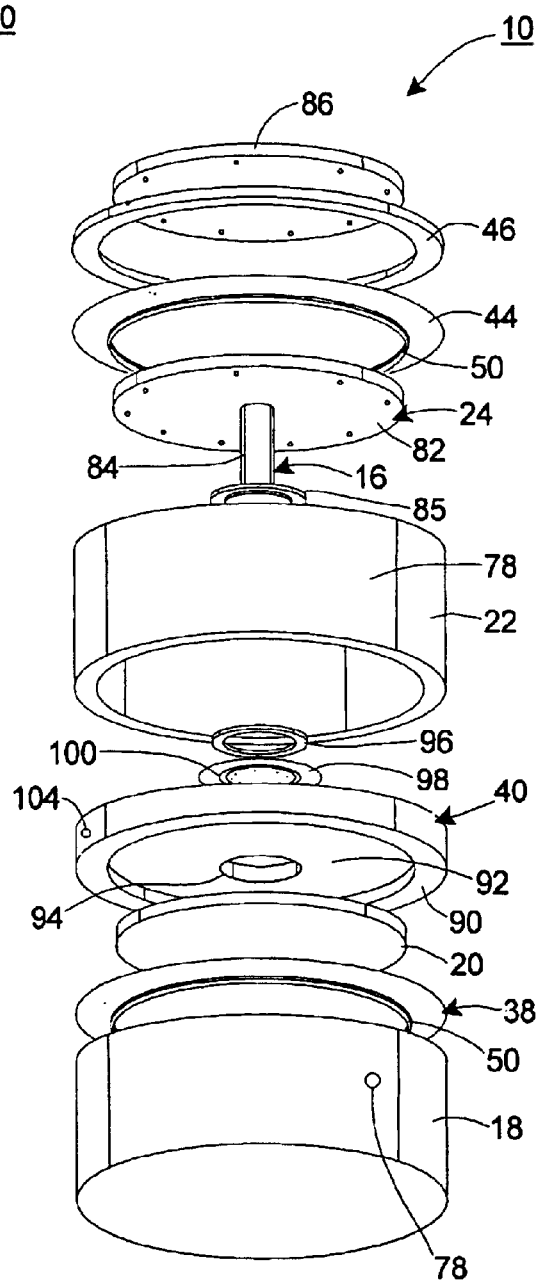
Fig. 2B                    Fig. 2C

MULTIPLE CHAMBER FLUID MOUNT

FIELD OF THE INVENTION

The present invention is directed to a fluid mount. More specifically, the present invention is directed to a multiple chamber fluid mount for an exposure apparatus and a method for making a multiple chamber fluid mount for dampening vibration. Additionally, the present invention is directed to an exposure apparatus having improved isolation.

BACKGROUND

Exposure apparatuses are commonly used to transfer images from a reticle onto a semiconductor wafer during semiconductor processing. A typical exposure apparatus includes an apparatus frame, a measurement system, a control system, an illumination source, an optical assembly, a reticle stage for retaining a reticle, and a wafer stage for retaining a semiconductor wafer.

The apparatus frame typically supports the measurement system, the illumination source, the reticle stage, the optical assembly, and the wafer stage above the ground. The measurement system monitors the positions of the stages relative to a reference such as the optical assembly. The optical assembly projects and/or focuses the light that passes through the reticle. One or more movers precisely position the reticle stage relative to the optical assembly. Similarly, one or more movers precisely position the wafer stage relative to the optical assembly.

The size of the images and the features within the images transferred onto the wafer from the reticle are extremely small. Accordingly, the precise positioning of the wafer and the reticle relative to the optical assembly is critical to the manufacture of high density, semiconductor wafers.

Unfortunately, mechanical vibrations and deformations in the apparatus frame of the exposure apparatus can influence the accuracy of the exposure apparatus. For example, the movers utilized to move the stages generate reaction forces that vibrate and deform the apparatus frame of the exposure apparatus. Further, the ground can transfer vibration to the apparatus frame.

The vibrations and deformations in the apparatus frame can move the stages and the optical assembly out of precise relative alignment. Further, the vibrations and deformations in the apparatus frame can cause the measurement system to improperly measure the positions of the stages relative to the optical assembly. Additionally, vibration of the optical assembly can cause deformations of the optical elements within the optical assembly and degrade the optical imaging quality. As a result thereof, the accuracy of the exposure apparatus and the quality of the integrated circuits formed on the wafer can be compromised.

One attempt to solve this problem involves the use of one or more air mounts to secure the apparatus frame to the ground. The air mounts reduce the effect of vibration of the ground causing vibration to the apparatus frame. Similarly, one or more air mounts can be used to secure the components of the exposure apparatus to the apparatus frame. Unfortunately, existing air mounts with adequate dampening capacity have a relatively large footprint. As a result thereof, the resulting exposure apparatus is larger. Further, the existing air mounts may reduce the access to the other components of the exposure apparatus.

In light of the above, there is a need for an exposure apparatus with an improved isolation system. Additionally, there is a need for a fluid mount having relatively small footprint with relatively high dampening ability. Further, there is a need for an exposure apparatus capable of manufacturing precision devices, such as high density, semiconductor wafers.

SUMMARY

The present invention is directed to a fluid mount for an exposure apparatus that satisfies these needs. The fluid mount includes a first subsystem and a second subsystem. The first subsystem includes a first cylinder and a first piston. The first piston moves within the first cylinder along a first axis. The second subsystem includes a second cylinder and a second piston. The second piston moves within the second cylinder along a second axis.

Importantly, the second axis is substantially coaxial with the first axis. Further, the first piston and the second piston are mechanically coupled together. Moreover, the second subsystem is stacked on top of the first subsystem. As a result of this design, the fluid mount has a smaller footprint with relatively high load carrying capacity.

As provided herein, the first piston cooperates with the first cylinder to define a first chamber and the second piston cooperates with the second cylinder to define a second chamber. Further, the first chamber can be in fluid communication with the second chamber.

Additionally, the fluid mount can include a third subassembly stacked on top of the second subassembly. The third subassembly includes a third cylinder and a third piston moving within the third cylinder along a third axis. The third axis is substantially coaxial with the first axis and the second axis. In this embodiment, the first piston, the second piston and the third piston are coupled together and move concurrently. Further, each of the pistons can be connected to the load.

The present invention is particularly useful as part of an exposure apparatus. For example, one or more fluid mounts can be used as part of a frame isolation system that secures an apparatus frame of the exposure apparatus to a mounting base. With this design, the frame isolation system reduces the effect of vibration of the mounting base causing vibration on the apparatus frame and the components that are secured to the apparatus frame.

Further, one or more of the fluid mounts can be used to secure one or more subassemblies of the exposure apparatus to the apparatus frame. For example, one or more fluid mounts could be used as part of an isolation system to secure a stage subassembly or an optical subassembly to the apparatus frame. With this design, the isolation system reduces the effect of vibration of the apparatus frame causing vibration on the stage subassembly or the optical subassembly.

The present invention is also directed to a device made with the exposure apparatus, a wafer made with the exposure apparatus, a method for making a fluid mount, a method for making an isolation system, a method for making an exposure apparatus, a method for making a device, and a method for making a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 2B is an upper, exploded perspective view of the fluid mount of FIG. 2A;

FIG. 2C is a lower, exploded perspective view of the fluid mount of FIG. 2A;

DESCRIPTION

Figure 1A:
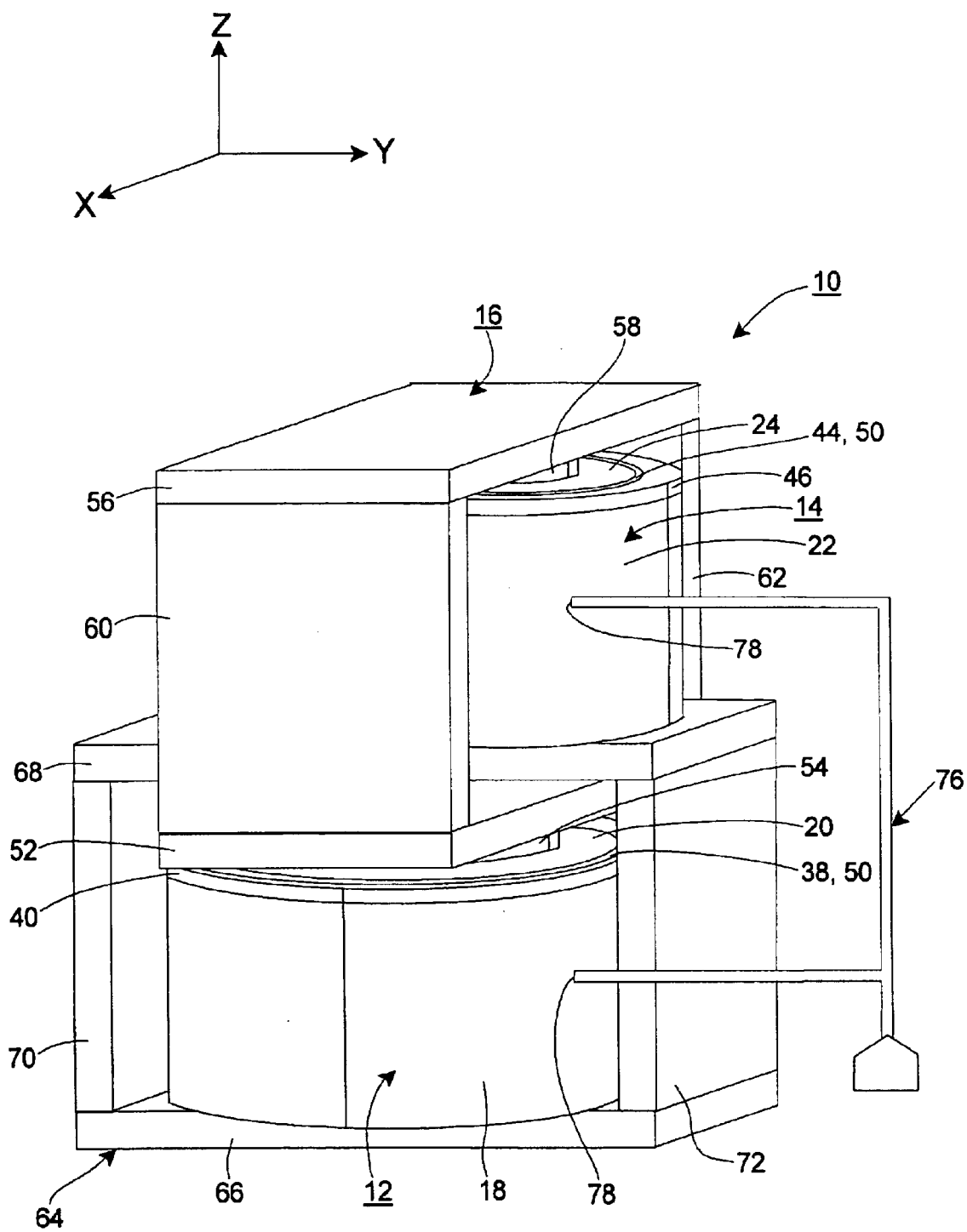
FIG. 1A is a perspective view of a first embodiment of a fluid mount having features of the present invention.

Referring initially to FIGS. 1A–3, the present invention is directed to a multiple chamber, fluid mount 10. A couple of alternate embodiments of the fluid mount 10 are provided herein. In each embodiment, the fluid mount 10 includes a first subsystem 12, a second subsystem 14, and a piston connector 16. The first subsystem 12 includes a first cylinder 18 and a first piston 20 and the second subsystem 14 includes a second cylinder 22 and a second piston 24. The first piston 20 moves within the first cylinder 18 along a first axis 26 and the second piston 24 moves within the second cylinder 22 along a second axis 28.

Uniquely, in each embodiment illustrated herein, the second subsystem 14 is stacked on top and positioned directly above the first subsystem 12, and the first axis 26 is substantially coaxial with the second axis 28. Further, the piston connector 16 mechanically couples and connects the first piston 20 to the second piston 24 so that the pistons 20, 24 move concurrently. With this design, the pistons 20, 24 cooperate to dampen vibration and support the load and the subsystems 12, 14 are effectively attached in parallel. The resulting fluid mount 10 has relatively high load carrying capacity with a relatively small footprint. Further, each of the pistons 20, 24 are connected to the load.

Figure 4:
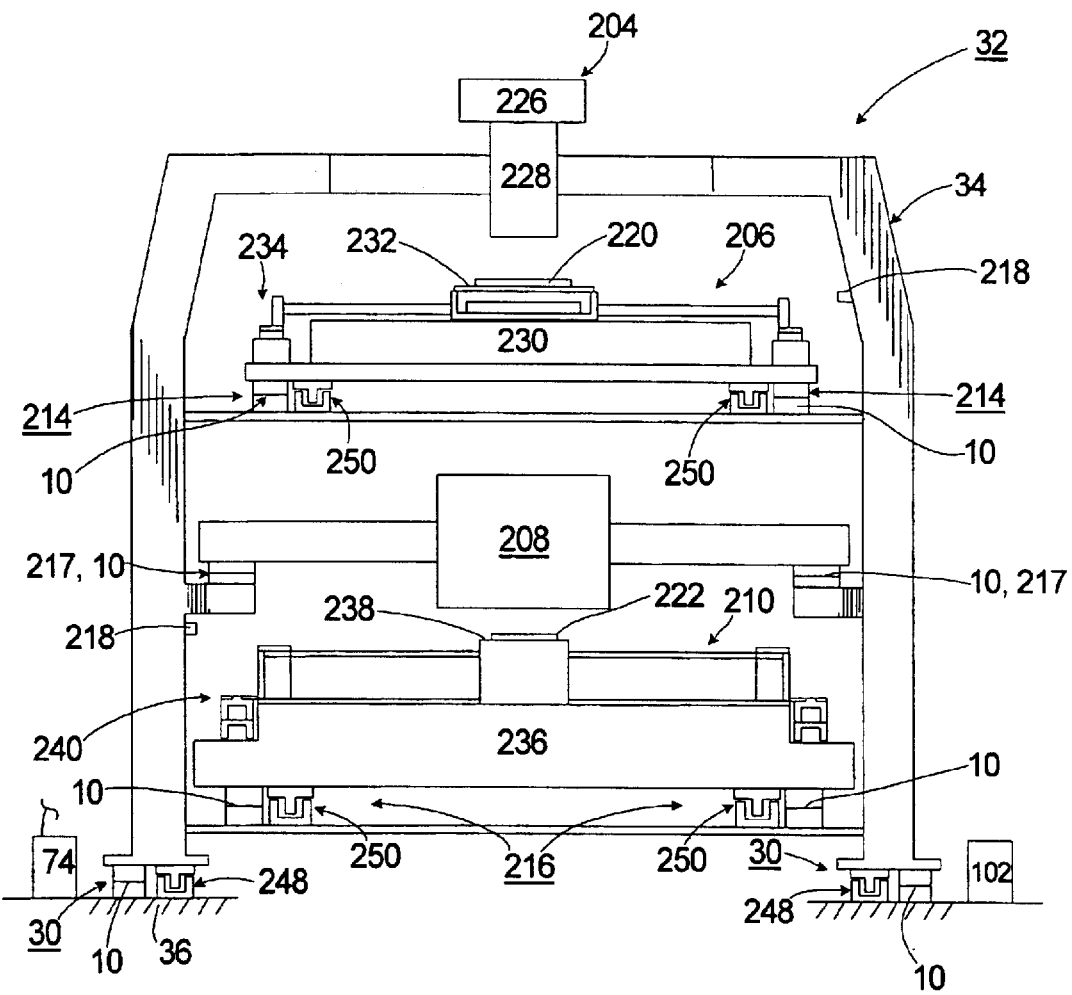
FIG. 4 is a front plan view of an exposure apparatus having features of the present invention.

The type of machine that utilizes the fluid mount 10 can be varied. For example, as illustrated in FIG. 4, one or more of the fluid mounts 10 can be used as part of a frame isolation system 30 for an exposure apparatus 32. In this embodiment, the frame isolation system 30 secures an apparatus frame 34 of the exposure apparatus 32 to a mounting base 36. The mounting base 36 can be the ground, a base, or floor or some other supporting structure. With this design, the frame isolation system 30 reduces the effect of vibration of the mounting base 36 causing vibration on the apparatus frame 34 and the components of the exposure apparatus 32 that are secured to the apparatus frame 34.

As provided above, the fluid mount 10 has relatively high load carrying capacity with a relatively small footprint. With this design, the required area for the fluid mount 10 in the exposure apparatus 32 is reduced and the fluid mount 10 can be incorporated into the exposure apparatus 32 easier. Further, this allows more space for the other components of the exposure apparatus 32. Moreover, this allows more space for access to the fluid mount 10 and the other components of the exposure apparatus 32 for service and adjustment.

Some of the Figures provided herein include a coordinate system that designates an X axis, a Y axis, and a Z axis. It should be understood that the coordinate system is merely for reference and can be varied. For example, the X axis can be switched with the Y axis and/or the exposure apparatus 10 can be rotated.

Figure 1B:
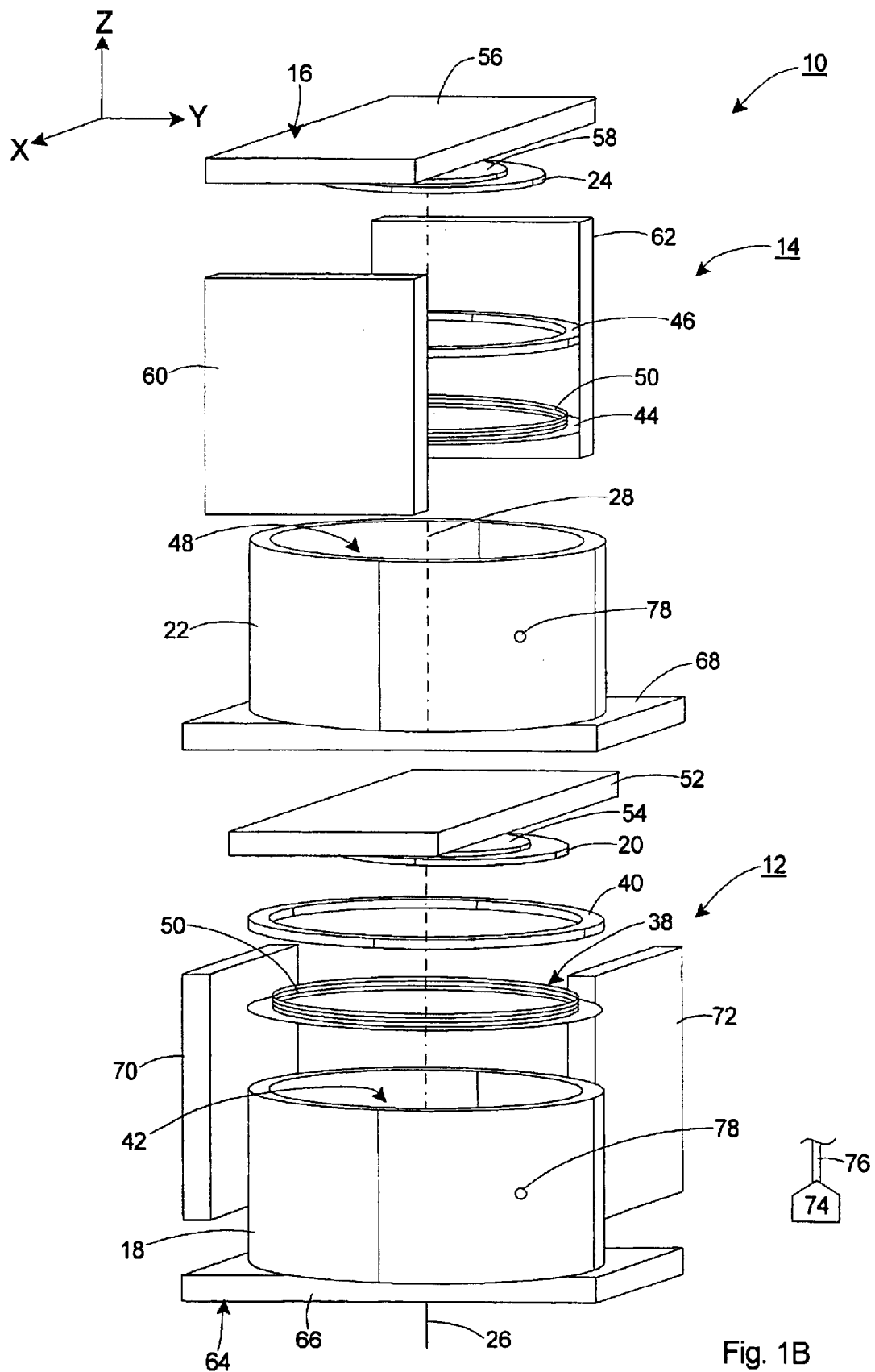
FIG. 1B is an exploded perspective view of the fluid mount of FIG. 1A.
Figure 2A:
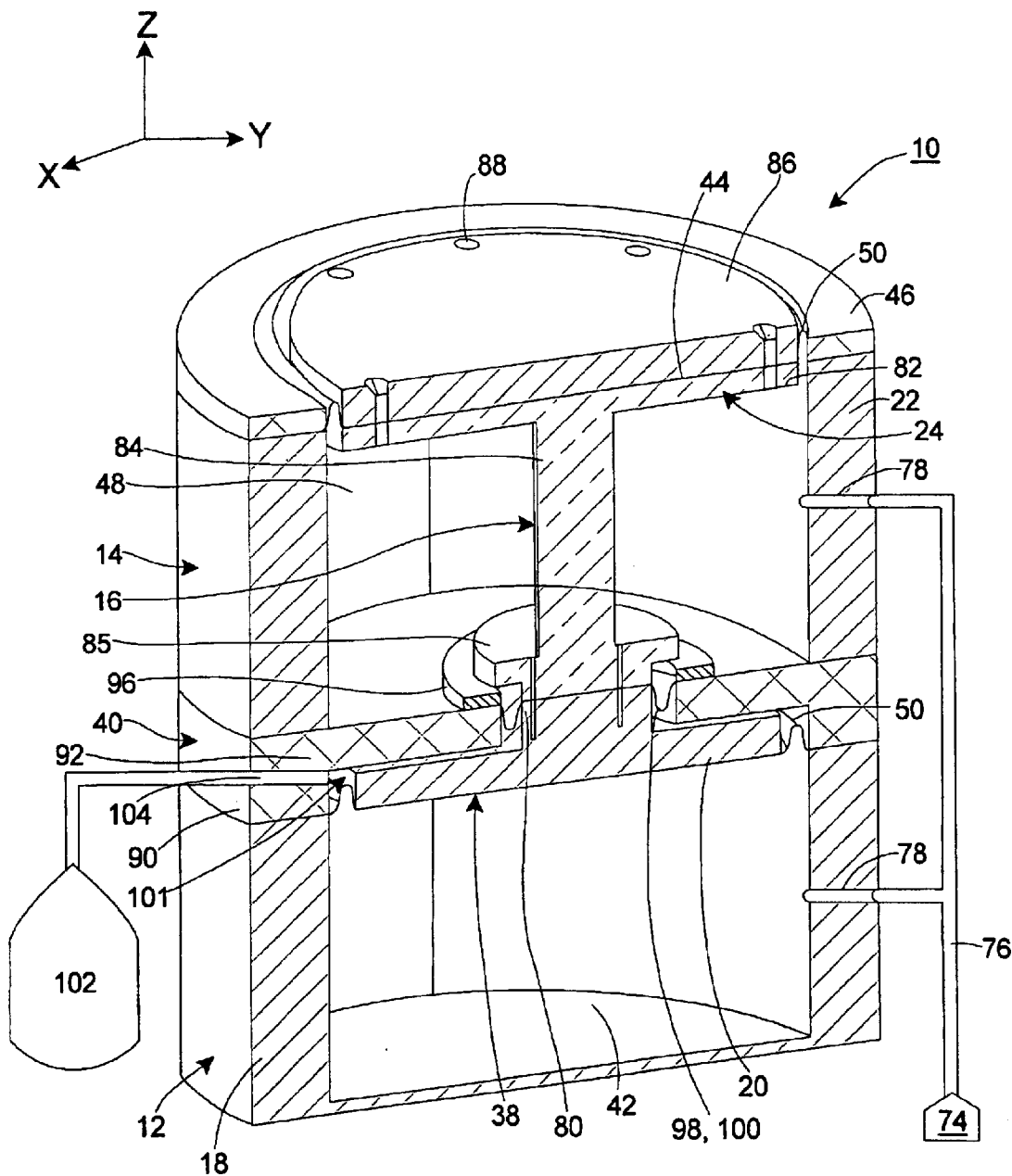
FIG. 2A is a perspective cut-away view of a second embodiment of a fluid mount having features of the present invention.
Figure 3:
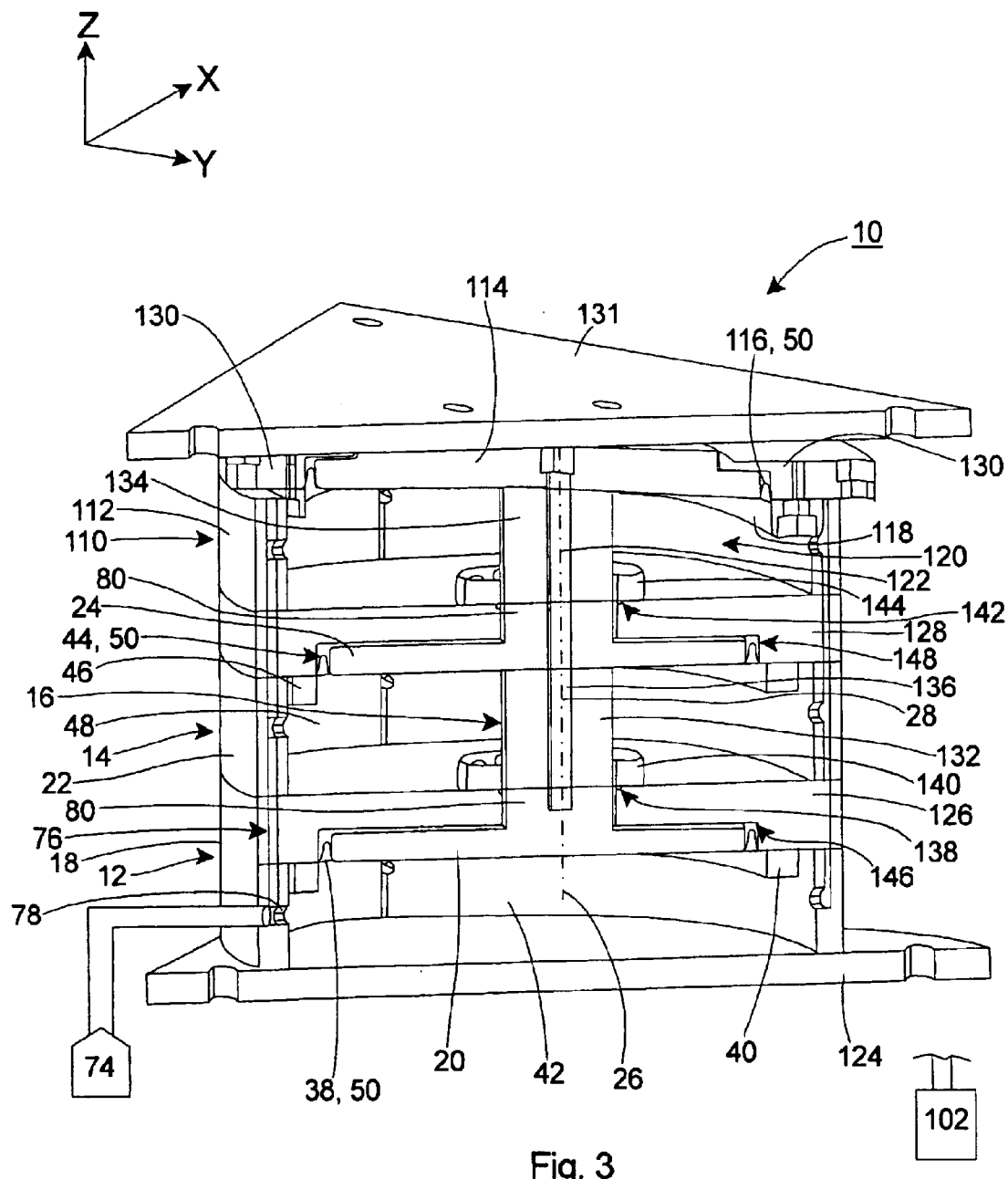
FIG. 3 is a perspective cut-away view of a third embodiment of a fluid mount having features of the present invention.

The design of the fluid mount 10 can be varied to suit the design requirements of the fluid mount 10. As provided above, a couple of alternate embodiments of the fluid mount 10 are illustrated herein. More specifically, FIGS. 1A and 1B illustrate a first embodiment of the fluid mount 10, FIGS. 2A–2C illustrate a second embodiment of the fluid mount 10 and FIG. 3 illustrates a third embodiment of the fluid mount 10. In each embodiment, the fluid mount 10 includes the first subsystem 12, the second subsystem 14, and the piston connector 16. Further, in each embodiment, the first subsystem 12 includes the first cylinder 18, the first piston 20, a first seal 38 and a first clamp 40 that cooperate of form a first chamber 42. Similarly, in each embodiment, the second subsystem 14 includes the second cylinder 20, the second piston 24, a second seal 44 and a second clamp 46 that cooperate of form a second chamber 48.

The size and shape of each of the cylinders 18, 22 can be varied to suit the design requirements of the fluid mount 10. In the embodiments illustrated in the FIGS. 1A and 1B, each of the cylinders 18, 22 includes a tubular shaped wall and an enclosed bottom. In the embodiments illustrated in the Figures, the wall of each of the cylinders 18, 22 is generally annular shaped. Alternately, for example, the wall could be square tube shaped.

The first piston 20 is sized and shaped to fit within the first cylinder 18 and move within the first cylinder 18. Similarly, the second piston 24 is sized and shaped to fit within the second cylinder 22 and move within the second cylinder 22. In the embodiment illustrated in the Figures, each of the pistons 20, 24 is generally disk shaped and has a generally circular shaped cross section.

The first seal 38 seals the first piston 20 to the first cylinder 18 and allows for motion of the first piston 20 relative to the first cylinder 18. Similarly, the second seal 44 seals the second piston 24 to the second cylinder 22 and allows for motion of the second piston 24 relative to the second cylinder 22. The design of each of the seals 38, 44 can be varied. In the embodiment illustrated in the Figures, each of the seals 38, 44, is a flat diaphragm made of a resilient material such as rubber. The bottom of the first piston 20 is secured to the top of the first seal 38. Similarly, the bottom of the second piston 24 is secured to the top of the second seal 44.

Preferably, each of the seals 38, 44 includes an annular shaped groove 50 that is positioned near the outer perimeter of the respective piston 20, 24. The groove 50 in the first seal 38 deflects to allow the first piston 20 to move relative to the first cylinder 18 without deforming the rest of the first seal 38. Similarly, the groove 50 in the second seal 44 deflects to allow the second piston 24 to move relative to the second cylinder 22 without deforming the rest of the second seal 44.

The first clamp 40 secures and seals the first seal 38 to the first cylinder 18. Similarly, the second clamp 46 secures and seals the second seal 44 to the second cylinder 22. The design of each clamp 40, 46 can be varied. In the embodiment illustrated in FIGS. 1A and 1B, each of the clamps 40, 46 is an annular shaped ring. In this embodiment, the first clamp 40 is secured to the top of the first cylinder 18 with an outer perimeter of the first seal 38 positioned between the first clamp 40 and the first cylinder 18. Similarly, the second clamp 46 is secured to the top of the second cylinder 22 with an outer perimeter of the second seal 44 positioned between the second clamp 46 and the second cylinder 22.

The piston connector 16 mechanically and rigidly connects the first piston 20 to the second piston 24. As a result thereof, the first piston 20 and the second piston 24 move concurrently and are connected together to the load. The design of the piston connector 16 can be varied to suit the design requirements of the fluid mount 10. In the embodiment illustrated in the FIGS. 1A and 1B, the piston connector 16 is generally rectangular frame shaped and encircles the second cylinder 22. In this embodiment, the piston connector 16 includes (i) a first plate 52 positioned above the first piston 20; (ii) a ring shaped first spacer 54 that is positioned between the first plate 52 and the first piston 20, the first spacer 54 fixedly securing the top of the first piston 20 to the bottom of the first plate 52; (iii) a second plate 56 that is substantially parallel with the first plate 52, the second plate 56 being positioned above the second piston 24; (iv) a ring shaped second spacer 58 that is positioned between the second plate 56 and second piston 24, the second spacer 58 fixedly securing the top of the second piston 24 to the bottom of the second plate 56; (v) a first side plate 60 that mechanically connects the first plate 52 to the second plate 56; and (vi) a second side plate 62 that is spaced apart from and substantially parallel with the first side plate 60, the second side plate 62 mechanically connects the first plate 52 to the second plate 56. Each of the plates 52, 56, 60, 62 is generally rigid. The second plate 56 of the piston connector 16 could be connected to the load such as the exposure apparatus that is supported by the fluid mount 10.

In the embodiments provided herein, the first cylinder 18 is also fixedly secured to the second cylinder 22. As a result thereof, the first cylinder 18 and the second cylinder 22 move concurrently. In the embodiment illustrated in FIGS. 1A and 1B, the fluid mount 10 includes a cylinder connector 64 that mechanically connects the first cylinder 18 to the second cylinder 22. In this embodiment, the cylinder connector 64 is generally rectangular frame shaped and encircles the first cylinder 18. In this embodiment, the cylinder connector 64 includes (i) a first connector plate 66 positioned below and secured to the first cylinder 18; (ii) a second connector plate 68 that is substantially parallel with the first connector plate 66, the second connector plate 68 is positioned below and secured to the second cylinder 22; (iii) a first side connector plate 70 that mechanically connects the first connector plate 66 to the second connector plate 68; and (iv) a second side connector plate 72 that is spaced apart from and substantially parallel with the first side connector plate 70, the second side connector plate 70 mechanically connects the first connector plate 66 to the second connector plate 68. Each of the connector plates 66, 68, 70, 72 is generally rigid.

The size and shape of each of the chambers 42, 48 varies according to the design of the rest of the components of the fluid mount 10. Preferably, the fluid mount 10 includes a control system 74 that actively controls and adjusts the pressure in each of the chambers 42, 44. The control system 74 can include one or more fluid pumps (not shown). With this design, the control system 74 can easily adjust the dampening characteristics and the height of the fluid mount 10.

Additionally, in the embodiments illustrated in the Figures, the fluid mount 10 includes a fluid connector 76 that connects the first chamber 42 in fluid communication with the second chamber 48. In the embodiment illustrated in FIGS. 1A and 1B, each cylinder 18, 22 includes a wall aperture 78 that extends through the wall of the respective cylinder 18, 22 and the fluid connector 76 is a tube that extends between the wall apertures 78. With this design, the pressure in the first chamber 42 is substantially equal to the pressure in the second chamber 48. Further, with this design, the control system 74 can concurrently adjust the pressure to each of the chambers 42, 48. If the chambers 42, 48 are in fluid communication, the subsystems 12, 14 are preferably similarly designed so that very little fluid transfers between the chambers 42, 48 during operation of the fluid mount 10.

Alternately, for example, the control system 74 can be separately connected to each of the chambers 42, 48. As a result of this design, the control system 74 can independently control the pressure to each of the chambers 42, 48. Still alternately, the chambers 42, 48 can be sealed or vented to the atmosphere. Further, the type of fluid utilized in the chambers 42, 48 can be varied. Moreover, one of the chambers could be sealed and the control system 74 could control the pressure in only one of the chambers.

As provided above, FIGS. 2A–2C illustrate a second embodiment of the fluid mount 10. In this embodiment, (i) the first cylinder 18, (ii) the first seal 38, (iii) the second seal 44, and (iv) the second clamp ring 46 are substantially similar to the corresponding components in the embodiment illustrated in FIGS. 1A and 1B and described above. However, the (i) the second cylinder 22, (ii) the first piston 20, (iii) the second piston 24, (iv) the first clamp 40, and (v) the piston connector 16 differ from the corresponding components in the embodiment illustrated in FIGS. 1A and 1B.

As an overview, in the embodiment illustrated in FIGS. 2A–2C, the piston connector 16 extends from the top of the first piston 20 to the bottom of the second piston 24 through the second chamber 48 along the second axis 28. In this embodiment, some of the components of the piston connector 16 are formed as part of the first piston 20 and the second piston 24. More specifically, referring to FIGS. 2A–2C, (i) the second cylinder 22 includes only the tubular shaped wall, (ii) the first piston 20 is disk shaped and includes a cylindrical shaped upper mount 80 that extends upward from the top center of the first piston 20 through the first clamp 40, (iii) the second piston 24 includes a disk shaped piston bottom 82, a connector shaft 84 that extends downward from the center of piston bottom 82, a bottom piston connector 85 that is positioned at the bottom of the connector shaft 84, a disk shaped, piston top plate 86, and a plurality of spaced apart piston bolts 88 that secure the piston bottom 82 to the piston top plate 86 with the second seal 44 positioned therebetween, and (iv) the first clamp 40 includes an annular shaped section 90 that secures and seals the first seal 38 to the first cylinder 18, a disk shaped section 92 that forms the bottom of the second cylinder 22, and a circular shaped, clamp aperture 94 that extends through the center of the first clamp 40 and allows the upper mount 80 of the first piston 20 to be connected to the connector shaft 84 of the second piston 24. Further, the disk shaped section 92 of the first clamp 40 acts as a stop that inhibits the first piston 20 from traveling too far upward. Because the first piston 20 is connected to the second piston 24, the first clamp 40 also inhibits the second piston 24 from moving too far upward.

As provided above, the piston connector 16 mechanically and rigidly connects the first piston 20 to the second piston 24. In the embodiment illustrated in FIGS. 2A–2C, the piston connector 16 includes the upper mount 80, the connector shaft 84, the bottom piston connector 85, a first connector clamp 96 and a first connector seal 98. The first connector seal 98 is flat diaphram shaped and includes an annular shaped groove 100 that allows the first piston 20 and the second piston 24 to move without deforming the rest of the first connector seal 98. In this embodiment, (i) the upper mount 80 is secured to the bottom piston connector 85 with the first connector seal 98 positioned therebetween, and (ii) the first connector clamp 96 seals an outer perimeter of the first connector seal 98 to the top of the disk shaped section 92 of the first clamp 40. With this design, the first connector seal 98 seals the bottom of the second chamber 48 and allows the connector shaft 84 to extend through the center of the second chamber 48. The piston top plate 86 of the piston connector 16 could be connected to the load such as the exposure apparatus that is supported by the fluid mount 10.

In this embodiment, it should be noted that an intermediate chamber 101 is formed in the area between the first seal 38 and the first connector seal 98. As provided herein, the pressure in the intermediate chamber 101 can be controlled to influence the performance of the fluid mount 10. For example, a gap control system 102 can be connected to a gap aperture 104 in the fluid mount 10 to control the pressure in the intermediate chamber 101. Preferably, the gap control system 102 includes a pump (not shown) that creates a vacuum in the intermediate chamber 101. This increases the lifting force of the fluid mount 10 and reduces the natural frequency of the fluid mount 10. Alternately, for example, the gap control system 102 can pressurize the intermediate chamber 101. Still alternately, the intermediate chamber 101 can be vented to the atmosphere.

It should be noted that in the embodiment illustrated in FIGS. 2A–2C, the first subsystem 12 has greater load carrying capacity than the second subsystem 14 because of the connector shaft 84 and the bottom piston connector 85. More specifically, the fluid pressure in the second chamber 48 pushes down against the bottom piston connector 85. As a result thereof, the total load carrying capacity of the second embodiment of fluid mount 10 is less than the first embodiment of the fluid mount 10. Alternately, the second embodiment of the fluid mount 10 has a slightly larger footprint than the first embodiment of the fluid mount 10.

As provided above, FIG. 3 illustrates a third embodiment of the fluid mount 10. The third embodiment of the fluid mount 10 is somewhat similar in structure to the second embodiment of the fluid mount 10. However, the third embodiment includes a third subsystem 110 stacked on top of the second subsystem 14 and the first subsystem 12. With the teachings provided herein, any number of subsystems can be stacked to increase the load carrying capacity of the fluid mount 10 without increasing the footprint of the fluid mount 10.

The third subsystem 110 includes a third cylinder 112, a third piston 114, a third seal 116 and a third clamp 118 that cooperate to form a third chamber 120. The third piston 114 is sized and shaped to fit within the third cylinder 112 and moves within the third cylinder 112 along a third axis 122. The third seal 116 seals the third piston 114 to the third cylinder 112 and allows for motion of the third piston 114 relative to the third cylinder 112. The third clamp 118 secures and seals the third seal 116 to the third cylinder 112.

In this embodiment, the piston connector 16 mechanically and rigidly connects the first piston 20, the second piston 24 and the third piston 114 together. As a result thereof, the first piston 20, the second piston 24 and the third piston 114 move concurrently. Further, the first axis 26 is substantially coaxial with the second axis 28 and the third axis 122.

In the embodiment illustrated in FIG. 3, (i) each of cylinders 18, 22, 112 is generally tubular shaped, (ii) each of the pistons 20, 24, 114 is generally disk shaped, the first piston 20 and the second piston 24 each include the cylindrical shaped upper mount 80, (iii) each of the seals 38, 44, 116 is generally flat diaphragm shaped and includes the annular shaped groove 50, and (iv) each of the clamps 40, 46,118 is generally annular shaped.

Additionally, in FIG. 3, the fluid mount 10 includes (i) a bottom plate 124 that forms the bottom of the first cylinder 18, (ii) a disk shaped, first intermediate plate 126 that is positioned between the first cylinder 18 and the second cylinder 22, the first intermediate plate 126 including a central plate aperture, (iii) a disk shaped, second intermediate plate 128 that is positioned between the second cylinder 22 and the third cylinder 112, the second intermediate plate 128 including a central plate aperture, (iv) a top plate 130 that forms the top of the third cylinder 112, and (v) an upper plate 131 that is secured to and moves with the third piston 114. The first clamp 40 secures the outer perimeter of the first seal 38 to the bottom of the first intermediate plate 126, the second clamp 46 secures the outer perimeter of the second seal 44 to the bottom of the second intermediate plate 128, and the third clamp 118 secures the outer perimeter of the third seal 116 to the bottom of the top plate 130. It should be noted that in this embodiment, (i) the first intermediate plate 126 acts as a stop that inhibits the first piston 20 from traveling too far upward, (ii) the second intermediate plate 128 acts as a stop that inhibits the second piston 24 from traveling too far upward, and (iii) the top plate 130 acts as a stop that inhibits the third piston 114 from traveling too far upward.

In this embodiment, the piston connector 16 mechanically and rigidly connects the first piston 20 to the second piston 24 and the third piston 114. Further, in the embodiment illustrated in FIG. 3, the piston connector 16 (i) extends from the top of the first piston 20 to the bottom of the second piston 24 through the second chamber 48 along the second axis 28, and (ii) extends from the top of the second piston 24 to the bottom of the third piston 114 through the third chamber 120 along the third axis 122. In this embodiment, some of the components of the piston connector 16 are formed as part of the first piston 20, the second piston 24, and the third piston 114. More specifically, in FIG. 3, the piston connector 16 includes (i) a cylindrical shaped first connector shaft 132 that extends from the upper mount 80 of the first piston 20 to the bottom of the second piston 24, (ii) a cylindrical shaped second connector shaft 134 that extends from the upper mount 80 of the second piston 24 to the bottom of the third piston 114, (iii) a connector bolt (not shown) that extends through a central connector aperture 136 in the third piston 114, the second connector shaft 134, the second piston 24, and the first connector shaft 132 and threads into the first piston 20 to rigidly connect the pistons 20, 24, 114 together, (iv) a diaphragm shaped first connector seal 138 that seals the bottom of the second chamber 48, (v) a first connector clamp 140 that secures an outer perimeter of the first connector seal 138 to the top of the first intermediate plate 126, (v) a diaphragm shaped second connector seal 142 that seals the bottom of the third chamber 120, and (v) a second connector clamp 144 that secures an outer perimeter of the second connector seal 142 to the top of the second intermediate plate 128.

The first connector seal 138 includes an annular shaped groove that allows the first piston 20 and the second piston 24 to move without deforming the rest of the first connector seal 138. With this design, the first connector seal 138 seals the bottom of the second chamber 48 and allows the first connector shaft 132 to extend through the center of the second chamber 48. Similarly, the second connector seal 142 includes an annular shaped groove that allows the second piston 24 and the third piston 114 to move without deforming the rest of the second connector seal 142. With this design, the second connector seal 142 seals the bottom of the third chamber 120 and allows the second connector shaft 134 to extend through the center of the third chamber 120. The upper plate 131 of the piston connector 16 could be connected to the load such as the exposure apparatus that is supported by the fluid mount 10.

In this embodiment, it should be noted that a first intermediate chamber 146 is formed in the area between the first seal 38 and the first connector seal 138. Similarly, a second intermediate chamber 148 is formed in the area between the second seal 44 and the second connector seal 142. As provided herein, the pressure in the intermediate chambers 146, 148 can be controlled to influence the performance of the fluid mount 10. For example, the gap control system 102 can be connected in fluid communication with the intermediate chambers 146, 148 to control the pressure in the intermediate chambers 146, 148. Preferably, the gap control system 102 creates a vacuum in the intermediate chambers 146, 148. This increases the lifting force of the fluid mount 10 and reduces the natural frequency of the fluid mount 10. Alternately, for example, the gap control system 102 can pressurize the intermediate chambers 146, 148. Still alternately, the intermediate chambers 146, 148 can be vented to the atmosphere.

It should also be noted that in this embodiment, the fluid connector 76 is a passageway in the walls of the cylinders 18, 22, 112 that connects the chambers 42, 48, 120 in fluid communication.

FIG. 4 is a schematic view illustrating the exposure apparatus 32 useful with the present invention. The exposure apparatus 32 includes the apparatus frame 34, an illumination system 204 (irradiation apparatus), a reticle stage subassembly 206, the optical subassembly 208 (lens assembly), a wafer substage assembly 210, the frame isolation system 30, a reticle stage isolation system 214, a wafer stage isolation system 216, an optical isolation system 217, and a measurement system 218. One or more of the fluid mounts 10 provided herein can be used in the frame isolation system 30, the reticle stage isolation system 214, the wafer stage isolation system 216, and/or the optical isolation system 217.

The exposure apparatus 32 is particularly useful as a lithographic device that transfers a pattern (not shown) of an integrated circuit from a reticle 220 onto a device such as a semiconductor wafer 222. The exposure apparatus 32 mounts to the mounting base 36, e.g., the ground, a base, or floor or some other supporting structure.

The apparatus frame 34 is rigid and supports the components of the exposure apparatus 32. The design of the apparatus frame 34 can be varied to suit the design requirements for the rest of the exposure apparatus 32. The apparatus frame 34 illustrated in FIG. 4 supports the optical assembly 208 and the illumination system 204, the reticle stage assembly 206, and the wafer stage assembly 210 above the mounting base 36.

The illumination system 204 includes an illumination source 226 and an illumination optical assembly 228. The illumination source 226 emits a beam (irradiation) of light energy. The illumination optical assembly 228 guides the beam of light energy from the illumination source 226 to the optical assembly 208. The beam illuminates selectively different portions of the reticle 220 and exposes the semiconductor wafer 222. In FIG. 4, the illumination source 226 is illustrated as being supported above the reticle stage assembly 206. Typically, however, the illumination source 226 is secured to one of the sides of the apparatus frame 34 and the energy beam from the illumination source 226 is directed to above the reticle stage assembly 206 with the illumination optical assembly 228.

The optical assembly 208 projects and/or focuses the light passing through the reticle to the wafer. Depending upon the design of the exposure apparatus 32, the optical assembly 208 can magnify or reduce the image illuminated on the reticle.

The reticle stage assembly 206 holds and positions the reticle 220 relative to the optical assembly 208 and the wafer 222. The reticle stage assembly 206 typically includes a reticle stage base 230, a reticle stage 232 that retains the reticle 220, and a reticle stage mover assembly 234 that moves the reticle stage 232 relative to the wafer 222. Depending upon the design, the reticle stage mover assembly 234 can include one or more actuators and motors that move the reticle stage 232.

Somewhat similarly, the wafer stage assembly 210 holds and positions the wafer 222 with respect to the projected image of the illuminated portions of the reticle 220. The wafer stage assembly 210 typically includes a wafer stage base 236, a wafer stage 238 that retains the wafer 222, and a wafer stage mover assembly 240 that moves the wafer stage 238. Depending upon the design, the wafer stage mover assembly 240 can include one or more actuators and motors that move the wafer stage 238.

The frame isolation system 30 secures the apparatus frame 34 to the mounting base 36 and reduces the effect of vibration of the mounting base 36 causing vibration to the apparatus frame 34. In this embodiment, the frame isolation system 30 includes (i) a plurality of spaced apart fluid mounts 10 that support weight of the apparatus frame 34, while remaining low in stiffness for good passive vibration isolation, and (ii) an plurality of spaced apart actuators 248 that isolate vibration and control the position of the apparatus frame 34 relative to the mounting base 36.

The number of fluid mounts 10 and actuators 248 in the frame isolation system 30 can be varied. For example, the frame isolation system 30 can include three spaced apart fluid mounts 10.

Preferably, the control system 74 actively controls the pressure in the fluid mounts 10 to compensate for low frequency disturbances such as a shift in the center of gravity in one the stage assemblies 206, 210. Further, the control system 74 adjusts the pressure in each fluid mount 10 to adjust the static or low frequency position of the apparatus frame 34 and to improve vibration isolation by reducing the stiffness.

Preferably, the actuators 248 adjust the position of the apparatus frame 34 relative to the mounting base 36 with at least three degrees of freedom and more preferably six degrees of freedom. The design of the actuators 248 can be varied. In the embodiment illustrated in the Figures, each of the actuators 248 is a voice-coil motor (VCM). Alternately, each of the actuators could be a linear motor, an electromagnetic actuator or some other type of actuator. The control system 74 directs and controls current to each of the actuators 248 to actively damp and control the position of the apparatus frame 34.

Preferably, the position and acceleration of the apparatus frame 34 relative to the mounting base 36 is be monitored with one or more position and/or acceleration sensors (not shown). With information from the sensors, the control system 74 can control the frame isolation system 30 to adjust and control the position of the apparatus frame 34 relative to the mounting base 36.

The reticle stage isolation system 214 secures and supports the reticle stage base 230 to the apparatus frame 34 and reduces the effect of vibration of the apparatus frame 34 causing vibration to the reticle stage base 230. In this embodiment, the reticle stage isolation system 214 includes (i) a plurality of spaced apart fluid mounts 10 that support weight of the reticle stage base 230, while remaining low in stiffness for good passive vibration isolation, and (ii) an plurality of spaced apart actuators 250 that isolate vibration and control the position of the reticle stage base 230 relative to the apparatus frame 34.

The number of fluid mounts 10 and actuators 250 in the reticle stage isolation system 214 can be varied. For example, the reticle stage isolation system 214 can include three spaced apart fluid mounts 10.

Preferably, the control system 74 actively controls the pressure in the fluid mounts 10 to compensate for low frequency disturbances and to adjust the static or low frequency position of the reticle stage base 230 and to improve vibration isolation by reducing the stiffness.

The actuators 250 actively damp and control the position of the reticle stage base 230. Preferably, the actuators 250 adjust the position of the reticle stage base 230 with at least three degrees of freedom and more preferably six degrees of freedom. In the embodiment illustrated in the Figures, each of the actuators 250 is a voice-coil motor (VCM). Alternately, each of the actuators 250 could be a linear motor, an electromagnetic actuator or some other type of actuator. The control system 74 directs and controls current to each of the actuators 250 to actively damp and control position. Preferably, the position and acceleration of the reticle stage base 230 is monitored with one or more position and/or acceleration sensors (not shown). With information from the sensors, the control system 74 can cooperate with the reticle stage isolation system 214 to adjust and control the position of the reticle stage base 230.

The wafer stage isolation system 216 secures and supports the wafer stage base 236 to the apparatus frame 34 and reduces the effect of vibration of the apparatus frame 34 causing vibration to the wafer stage base 236. The wafer stage isolation system 216 is similar to the reticle stage isolation system 214 discussed above. The optical isolation system 217 secures the optical assembly 208 to the apparatus frame 34 and reduces the effect of vibration of the apparatus frame 34 causing vibration to the optical assembly 208. The optical isolation system 217 is similar to the reticle stage isolation system 214 discussed above.

The measurement system 218 monitors movement of the reticle stage 232 and the wafer stage 238 relative to the optical assembly 208. The design of the measurement system 218 can be varied. For example, the measurement system 218 can utilize laser interferometers, encoders, and/or other measuring devices to monitor the position of the reticle stage 232 and the wafer stage 238.

There are a number of different types of lithographic devices. For example, the exposure apparatus 32 can be used as scanning type photolithography system that exposes the pattern from the reticle onto the wafer with the reticle and the wafer moving synchronously. In a scanning type lithographic device, the reticle is moved perpendicular to an optical axis of the optical assembly 208 by the reticle stage assembly 206 and the wafer is moved perpendicular to an optical axis of the optical assembly 208 by the wafer stage assembly 210. Scanning of the reticle and the wafer occurs while the reticle and the wafer are moving synchronously. Alternately, the exposure apparatus 32 can be a step-and-repeat type photolithography system that exposes the reticle while the reticle and the wafer are stationary. In the step and repeat process, the wafer is in a constant position relative to the reticle and the optical assembly 208 during the exposure of an individual field. Subsequently, between consecutive exposure steps, the wafer is consecutively moved by the wafer stage perpendicular to the optical axis of the optical assembly 208 so that the next field of the wafer is brought into position relative to the optical assembly 208 and the reticle for exposure. Following this process, the images on the reticle are sequentially exposed onto the fields of the wafer so that the next field of the wafer is brought into position relative to the optical assembly 208 and the reticle.

However, the use of the exposure apparatus 32 provided herein is not limited to a photolithography system for semiconductor manufacturing. The exposure apparatus 32, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the fluid mount 10 provided herein can be used in other devices, including other semiconductor processing equipment, elevators, machine tools, metal cutting machines, inspection machines and disk drives.

The illumination source 226 can be g-line (436 nm), i-line (365 nm), KrF excimer laser (248 nm), ArF excimer laser (193 nm) and $F_2$ laser (157 nm). Alternately, the illumination source 226 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

In terms of the magnification of the optical assembly 208 included in the photolithography system, the optical assembly 208 need not be limited to a reduction system. It could also be a 1× or magnification system. With respect to the optical assembly 208, when far ultra-violet rays such as the excimer laser is used, glass materials such as quartz and fluorite that transmit far ultra-violet rays is preferable to be used. When the $F_2$ type laser or x-ray is used, the optical assembly 208 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

Further, in photolithography systems, when linear motors (see U.S. Pat. Nos. 5,623,853 or 5,528,100) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,100 are incorporated herein by reference. Alternatively, one of the stages could be driven by a planar motor, which drives the stage by an electromagnetic force generated by a magnet unit having two-dimensionally arranged magnets and an armature coil unit having two-dimensionally arranged coils in facing positions. With this driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

As described above, a photolithography system (an exposure apparatus) according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 5:
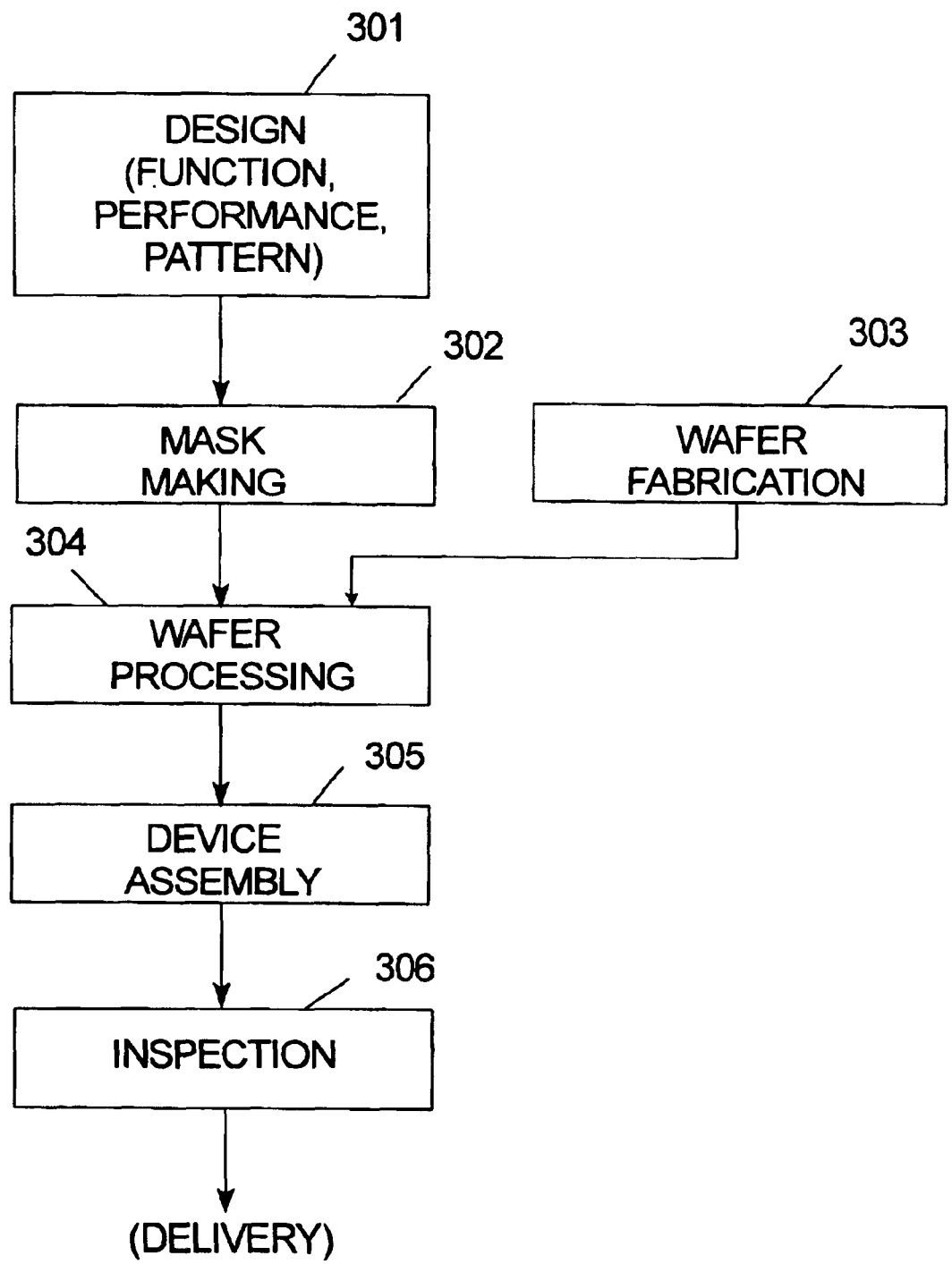
FIG. 5 is a flow chart that outlines a process for manufacturing a device in accordance with the present invention.

Further, semiconductor devices can be fabricated using the above described systems, by the process shown generally in FIG. 5. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), finally, the device is then inspected in step 306.

Figure 6:
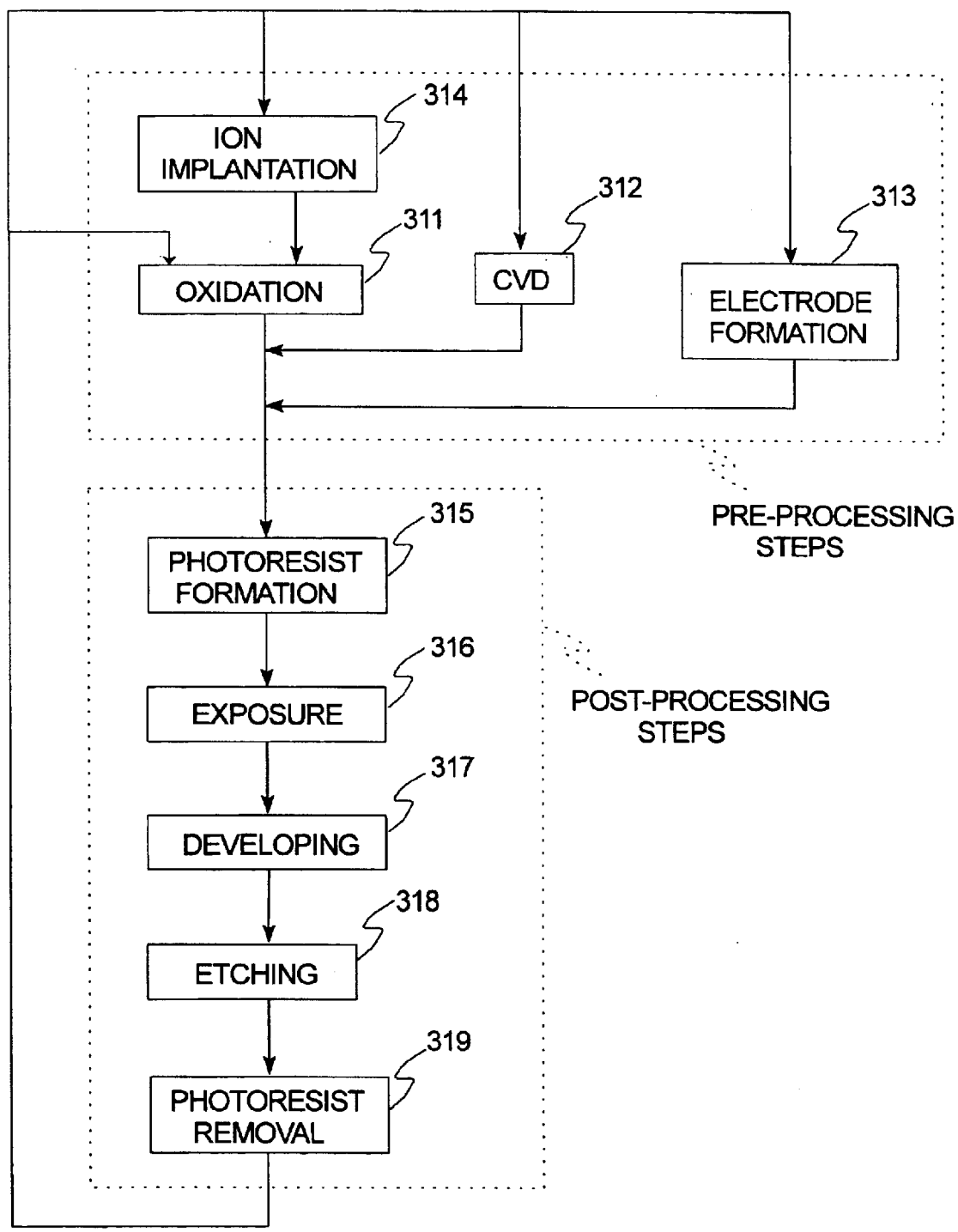
FIG. 6 is a flow chart that outlines device processing in more detail.

FIG. 6 illustrates a detailed flowchart example of the above-mentioned step 304 in the case of fabricating semiconductor devices. In FIG. 6, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While the particular fluid mount 10 and exposure apparatus 32 as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A fluid mount comprising:
   a first subsystem including a first cylinder and a first piston, the first piston moving within the first cylinder and cooperating with the first cylinder to define a first chamber;
   a second subsystem including a second cylinder and a second piston, the second piston moving within the second cylinder and cooperating with the second cylinder to define a second chamber;
   an intermediate chamber positioned between the first chamber and the second chamber; and
   a control system that is connected to the intermediate chamber, the control system actively adjusting a pressure inside the intermediate chamber to be below the lower one of a pressure inside the first chamber and a pressure inside the second chamber.

2. The fluid mount of claim 1 wherein the first piston moves along a first axis and the second piston moves along a second axis that is substantially coaxial with the first axis.

3. The fluid mount of claim 1 further comprising a piston connector that couples the first piston to the second piston so that the first piston and the second piston move concurrently.

4. The fluid mount of claim 3 wherein the piston connector extends around the second cylinder.

5. The fluid mount of claim 3 wherein the piston connector is encircled by the second cylinder.

6. The fluid mount of claim 1 wherein the first chamber is in fluid communication with the second chamber.

7. The fluid mount of claim 1 wherein the control system adjusts the pressure inside at least one of the first chamber and the second chamber.

8. The fluid mount of claim 1 wherein the second subsystem is positioned directly above the first subsystem.

9. The fluid mount of claim 8 wherein the second subsystem is stacked on top of the first subsystem.

10. The fluid mount or claim 1 further comprising (i) a third subsystem that includes a third cylinder and a third piston moving within the third cylinder, the third piston cooperating with the third cylinder to define a third chamber, (ii) a piston connector that couples the first piston, the second piston and the third piston together so that the pistons move concurrently, and (iii) a second intermediate chamber positioned between the second chamber and the third chamber, wherein the control system adjusts a pressure inside at least one of the intermediate chamber and the second intermediate chamber to be below atmospheric pressure.

11. The fluid mount of claim 10 wherein the third piston moves along a third axis that is substantially coaxial with the first axis and the second axis.

12. An isolation system including the fluid mount of claim 1.

13. An exposure apparatus including an apparatus frame and the fluid mount of claim 1 securing the apparatus frame to a mounting base.

14. A method for making a fluid mount, the method comprising the steps of:
providing a first subsystem including a first cylinder and a first piston, the first piston moving within the first cylinder;
providing a second subsystem including a second cylinder and a second piston, the second piston moving within the second cylinder;
coupling the first piston to the second piston with a piston connector so that the first piston and the second piston move substantially concurrently;
positioning the second subsystem directly on top of the first subsystem;
providing an intermediate chamber between the first subsystem and the second subsystem; and
providing a control system that is connected to the intermediate chamber and actively adjusts a pressure inside the intermediate chamber to be below the lower one of a pressure inside the first subsystem and a pressure inside the second subsystem.

15. The method of claim 14 wherein the first piston moves along a first axis and the second piston moves along a second axis and further comprising the step of positioning the second subsystem relative to the first subsystem so that the second axis is substantially coaxial with the first axis.

16. The method of claim 14 further comprising steps of (i) providing a third subsystem that includes a third cylinder and a third piston moving within the third cylinder, and (ii) coupling the first piston, the second piston and the third piston together with a piston connector so that the pistons move concurrently.

17. The method of claim 16 wherein the first piston moves along a third axis and further comprising the step of positioning the third subsystem relative to the first subsystem and the second subsystem so that the third axis is substantially coaxial with the first axis and the second axis.

18. A method for making an isolation system including the step of providing a fluid mount made in accordance with claim 14.

19. A method for making an exposure apparatus including the steps of providing an apparatus frame and securing the apparatus frame to a mounting base with a fluid mount made in accordance with claim 14.

20. A method of making a wafer utilizing the exposure apparatus made by the method of claim 19.

21. A method of making a device including at least an exposure process, wherein the exposure process utilizes the exposure apparatus made by the method of claim 19.

22. A method for supporting a load comprising the steps of:
providing a first subsystem including a first cylinder and a first piston, the first piston moving within the first cylinder along a first axis;
providing a second subsystem including a second cylinder and a second piston, the second piston moving within the second cylinder along a second axis that is substantially coaxial with the first axis;
providing an intermediate chamber between the first subsystem and the second subsystem;
controlling the pressure of at least one of the subsystems and actively adjusting a pressure inside the intermediate chamber to be below the lower of a pressure inside the first subsystem and a pressure inside the second subsystem;
connecting the first piston with the load; and
connecting the second piston with the load.

23. The method of claim 22 wherein the step of controlling the pressure of at least one of the subsystems includes the step of controlling the pressure of each subsystem independently.

24. The method of claim 22 wherein the step of controlling the pressure includes the step of adjusting the pressure inside the intermediate chamber to be below atmospheric pressure.

25. The fluid mount of claim 1 wherein the control system adjusts the pressure inside the intermediate chamber to be below atmospheric pressure.

26. The method of claim 14 wherein the control system adjusts the pressure inside the intermediate chamber to be below atmospheric pressure.

27. A fluid mount comprising:
a first subsystem including a first cylinder and a first piston, the first piston moving within the first cylinder along a first axis;
a second subsystem including a second cylinder and a second piston, the second piston moving within the second cylinder along a second axis that is substantially coaxial with the first axis;
a cylinder connector that holds the first cylinder and the second cylinder, the cylinder connector lining up the first cylinder and the second cylinder along the first axis; and
a piston connector that couples the first piston and the second piston, the piston connector extending around the second cylinder.

28. The fluid mount of claim 27 wherein the first piston cooperates with the first cylinder to define a first chamber and wherein the second piston cooperates with the second cylinder to define a second chamber.

29. The fluid mount of claim 28 wherein the first chamber is in fluid communication with the second chamber.

30. The fluid mount of claim 28 further comprising a control system that is connected to at least one of the subsystems and adjusts a pressure inside at least one of the chambers.

31. A fluid mount comprising:
a first subsystem including a first cylinder, a first piston and a first seal, the first piston moving within the first cylinder, the first seal being fixedly secured to the first cylinder and the first piston; and
a second subsystem including a second cylinder, a second piston and a second seal, the second piston moving within the second cylinder, the second seal being fixedly secured to the second cylinder and the second piston, wherein the second piston moves concurrently with the first piston.

32. The fluid mount of claim 31 wherein the first subsystem further includes a first clamp that fixedly secures the first seal to the first cylinder and wherein the second subsystem further includes a second clamp that fixedly secures the second seal to the second cylinder.

33. The fluid mount of claim 31 further comprising a piston connector that couples the first piston to the second piston so that the first piston and the second piston move concurrently.

34. The fluid mount of claim 31 wherein the first piston cooperates with the first cylinder to define a first chamber and wherein the second piston cooperates with the second cylinder to define a second chamber.

35. The fluid mount of claim 34 further comprising an intermediate chamber positioned between the first chamber and the second chamber, and a control system that adjusts a pressure inside the intermediate chamber to be below the lower one of a pressure inside the first subsystem and a pressure inside the second subsystem.

36. The fluid mount of claim 31 further comprising (i) a third subsystem that includes a third cylinder, a third piston and a third seal, the third piston moving within the third cylinder, the third seal being fixedly secured to the third cylinder and the third piston, and (ii) a piston connector that couples the first piston, the second piston and the third piston together so that the pistons move concurrently.

37. An isolation system including the fluid mount of claim 31.

38. An exposure apparatus including an apparatus frame and the fluid mount of claim 31 securing the apparatus frame to a mounting base.

39. A fluid mount comprising:
a first subsystem including a first cylinder and a first piston, the first piston moving within the first cylinder and cooperating with the first cylinder to define a first chamber;
a second subsystem including a second cylinder and a second piston, the second piston moving within the second cylinder and cooperating with the second cylinder to define a second chamber;
an intermediate chamber positioned between the first chamber and the second chamber; and
a control system that actively and concurrently adjusts a pressure inside each of the first chamber, the second chamber and the intermediate chamber.

40. The fluid mount of claim 39 further comprising a piston connector that couples the first piston to the second piston so that the first piston and the second piston move concurrently.

41. The fluid mount of claim 39 further comprising (i) a third subsystem that includes a third cylinder and a third piston, the third piston moving within the third cylinder and cooperating with the third cylinder to define a third chamber, and (ii) a piston connector that couples the first piston, the second piston and the third piston together so that the pistons move concurrently.

42. The fluid mount of claim 41 further comprising a second intermediate chamber positioned between the second chamber and the third chamber, wherein the control system actively and concurrently adjusts the pressure inside each of the first chamber, the second chamber, the third chamber, the intermediate chamber and the second intermediate chamber.

* * * * *